US009437277B1

United States Patent
Welker et al.

(10) Patent No.: US 9,437,277 B1
(45) Date of Patent: Sep. 6, 2016

(54) MECHANISM FOR DATA GENERATION IN DATA PROCESSING SYSTEMS

(71) Applicant: FREESCALE SEMICONDUCTOR, INC., Austin, TX (US)

(72) Inventors: James A. Welker, Leander, TX (US); Joshua Siegel, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/718,407

(22) Filed: May 21, 2015

(51) Int. Cl.
| | |
|---|---|
| G11C 11/40 | (2006.01) |
| G11C 11/4076 | (2006.01) |
| G11C 11/4096 | (2006.01) |
| G11C 7/22 | (2006.01) |
| G11C 7/10 | (2006.01) |
| H03M 5/00 | (2006.01) |
| H03M 5/02 | (2006.01) |
| H03M 5/04 | (2006.01) |
| H04B 1/38 | (2015.01) |
| H04B 1/40 | (2015.01) |

(52) U.S. Cl.
CPC ......... *G11C 11/4076* (2013.01); *G11C 7/1072* (2013.01); *G11C 7/22* (2013.01); *G11C 7/222* (2013.01); *G11C 11/4096* (2013.01); *H03M 5/00* (2013.01); *H03M 5/02* (2013.01); *H03M 5/04* (2013.01); *H04B 1/38* (2013.01); *H04B 1/40* (2013.01)

(58) Field of Classification Search
CPC ....... G11C 7/222; G11C 7/1072; G11C 7/22; G11C 11/4076; G11C 11/4096; H03M 5/00; H03M 5/02; H03M 5/04; H04B 1/38; H04B 1/40

See application file for complete search history.

(56) References Cited

U.S. PATENT DOCUMENTS

| | | | |
|---|---|---|---|
| 6,438,703 B1 * | 8/2002 | Berning | G06F 5/06 713/401 |
| 6,448,807 B1 * | 9/2002 | Ahsanullah | H03K 17/164 326/26 |
| 6,760,856 B1 | 7/2004 | Borkenhagen et al. | |
| 7,129,859 B2 * | 10/2006 | Dreps | H04L 25/03866 341/50 |
| 7,181,638 B2 | 2/2007 | Welker et al. | |
| 7,826,566 B2 * | 11/2010 | Walker | G06F 13/4295 375/259 |
| 8,503,568 B1 * | 8/2013 | Pheiffer | H04L 27/10 375/244 |
| 9,054,941 B2 * | 6/2015 | Ngo | H04L 25/4904 |

* cited by examiner

*Primary Examiner* — Vanthu Nguyen

(57) ABSTRACT

An integrated circuit includes enable circuitry coupled to receive transmit data and configured to set a clock enable to a first logic state when a data value of the transmit data changes to a different logic state. The circuit also includes clock control circuitry coupled to receive the clock enable and a data rate clock and configured to provide a filtered data rate clock, wherein the data rate clock is provided as the filtered data rate clock while the clock enable is the first logic state. The circuit also includes a flip flop having a clock input coupled to receive the filtered data rate clock, a data output coupled to provide final transmit data in response to the filtered data rate clock, and an inverting data input coupled to the data output, wherein the final transmit data corresponds to a first delayed version of the transmit data.

20 Claims, 3 Drawing Sheets

MECHANISM FOR DATA GENERATION IN DATA PROCESSING SYSTEMS

BACKGROUND

1. Field

This disclosure relates generally to data processing systems, and more specifically, to preserving duty cycle when transmitting data.

2. Related Art

In a data processing system, a memory controller typically interfaces between a processing module and a memory, where the memory controller receives a write request and write data from the processing module and communicates the write request and write data to the memory. In some data processing systems, a dual data rate (DDR) memory system is utilized, where the memory controller transfers data to the memory on both the rising and falling edges of a transfer clock signal, also referred to as a data strobe signal.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

In a data processing system that implements a dual data rate (DDR) memory system, a memory controller transmits write data in a number of data portions, or data beats, to a memory. The memory controller also transmits a data strobe, or transfer clock signal, to the memory. Memory controller delays each data beat of the write data for an amount of time long enough to align the center of the data beat (also referred to as a data eye) around each positive and negative edge of the data strobe. Often, a delay chain is utilized to delay the data beats, the data strobe, or both. However, a delay chain includes a number of delay elements that introduce mismatched propagation delays introduced by the various delay elements. Since the data beats are transmitted as a periodic data signal, the duty cycle (e.g., the ratio or percentage of a period during which a signal is active) of the data signal often becomes irregular after traversing the delay chain. While duty cycle degradation may only be around 10 to 20 picoseconds, such degradation becomes critical as DDR transfer rates increase, where such duty cycle degradation may possibly prevent the transmitted data signal from satisfying setup and hold time requirements on each edge of the data strobe when received by the memory (e.g., a duty cycle of the data signal degrades significantly).

The present disclosure provides a mechanism for data generation implemented in a data processing system (e.g., in a memory controller) that avoids duty cycle degradation of a data signal transmitted to memory. Rather than sending the data signal through a delay chain, an intermediate signal representing transition states of the data signal is generated and sent through a delay chain, where the duty cycle of the intermediate signal is not critical and does not need to be preserved. The intermediate signal is used to clock output circuitry that recreates the data signal, based on the transition states reflected in the intermediate signal. The recreated data signal is then transmitted to the memory with the data strobe (as generated by the memory controller) having edges centered within data beats of the recreated data signal. The mechanism is further discussed below.

Example Embodiments

Figure 1:
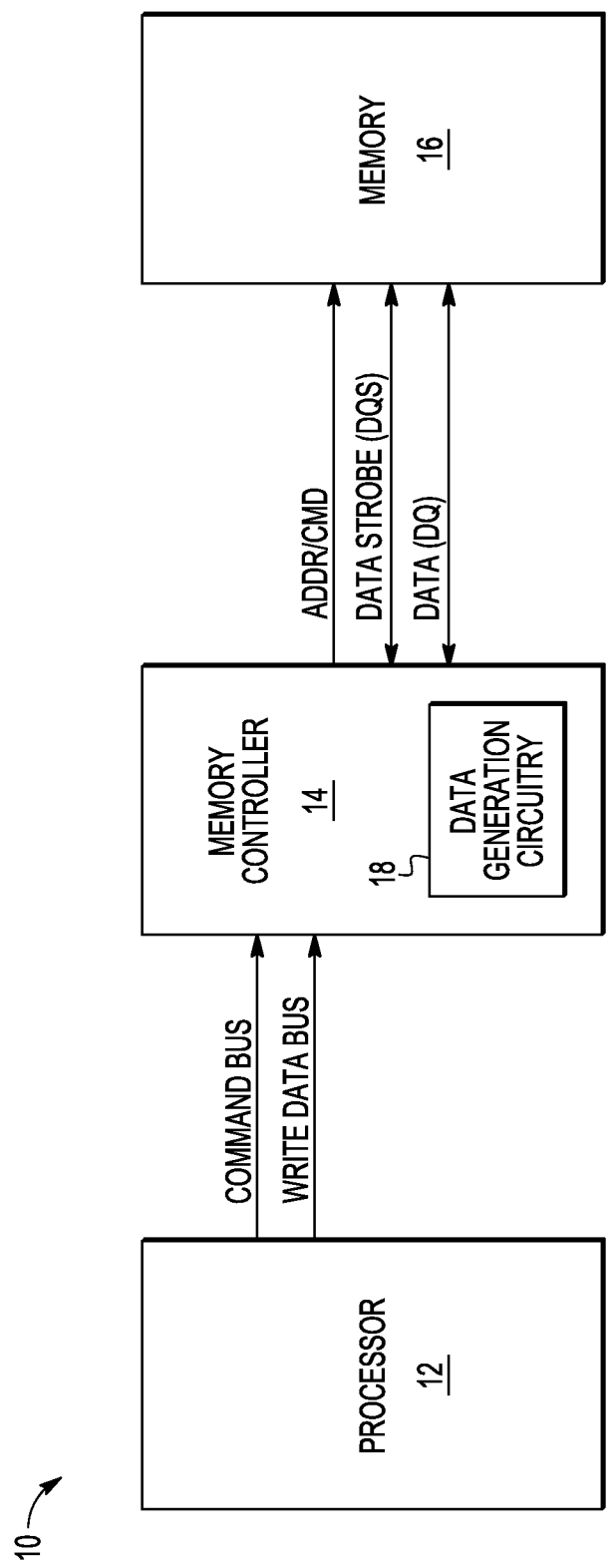
FIG. 1 illustrates a block diagram depicting an example data processing system in which the disclosure is implemented, according to some embodiments.

FIG. 1 illustrates a block diagram depicting an example data processing system 10 in which the disclosure is implemented. Data processing system 10 includes a processor 12, a memory controller 14, and a memory 16. Processor 12 is coupled to memory controller 14 via a command bus and a write data bus. Memory controller 14 is coupled to memory 16 and provides an address/command (by way of ADDR/CMD) to memory 16. A data strobe (DQS) signal and data (DQ) are communicated between memory controller 14 and memory 16. In some embodiments, memory controller 14 and memory 16 implement a DDR (dual data rate) memory system.

In operation, processor 12 provides write requests to memory controller 14 for storing write data into memory 16. For each write request, a write command and address location is provided by way of the command bus to memory controller 14. Additional attributes, such as the size of the write data for the write command, may also be provided to memory controller 14 on the command bus as part of the write request. The write data corresponding to a write request is provided to memory controller 14 on the write data bus. Memory controller 14 performs each write request from processor 12 by generating and providing commands and appropriate addresses to memory 16 by way of ADDR/CMD, appropriately toggling data strobe (DQS), and providing the write data as data (DQ) to memory 16. Memory 16 stores the received write data at the indicated address location.

In some embodiments, writes to memory 16 are performed as burst writes. For each burst write, a particular number of data beats (referred to as a burst size) are provided by memory controller 14 to memory 16. In some embodiments, each data beat is a predetermined size. For each data beat of the burst write, memory controller 14 toggles DQS to indicate to memory 16 that a beat is being provided. For example, each data beat of a burst write is 8 bytes, and each burst has a burst size of 4 data beats (corresponding to 32 bytes of data), where memory 16 is configured to store a burst size of 4 beats with each burst write. In some embodiments, memory 16 includes a plurality of DRAM (dynamic random-access memory) chips that are utilized to store 4 or 8 bytes on a given beat, where each DRAM chip may store ½, 1, or 2 bytes of data. In other embodiments, a data beat may include more or fewer bytes, where memory 16 is configured to store a burst size having more or fewer data beats. For each data beat provided to memory 16, memory controller 14 toggles data strobe (DQS), where each edge of data strobe (DQS) is centered within a corresponding data beat of a burst write. For example, if a rising edge of data strobe is centered within a given data beat, a subsequent falling edge of data strobe is centered within a subsequent data beat.

In the embodiment illustrated, memory controller 14 implements data generation circuitry 18 configured to generate data (DQ) for transmission to memory 16 in a manner that minimizes duty cycle degradation of the data (DQ). Data generation circuitry 18 is further discussed in connection with FIG. 2.

Figure 2:
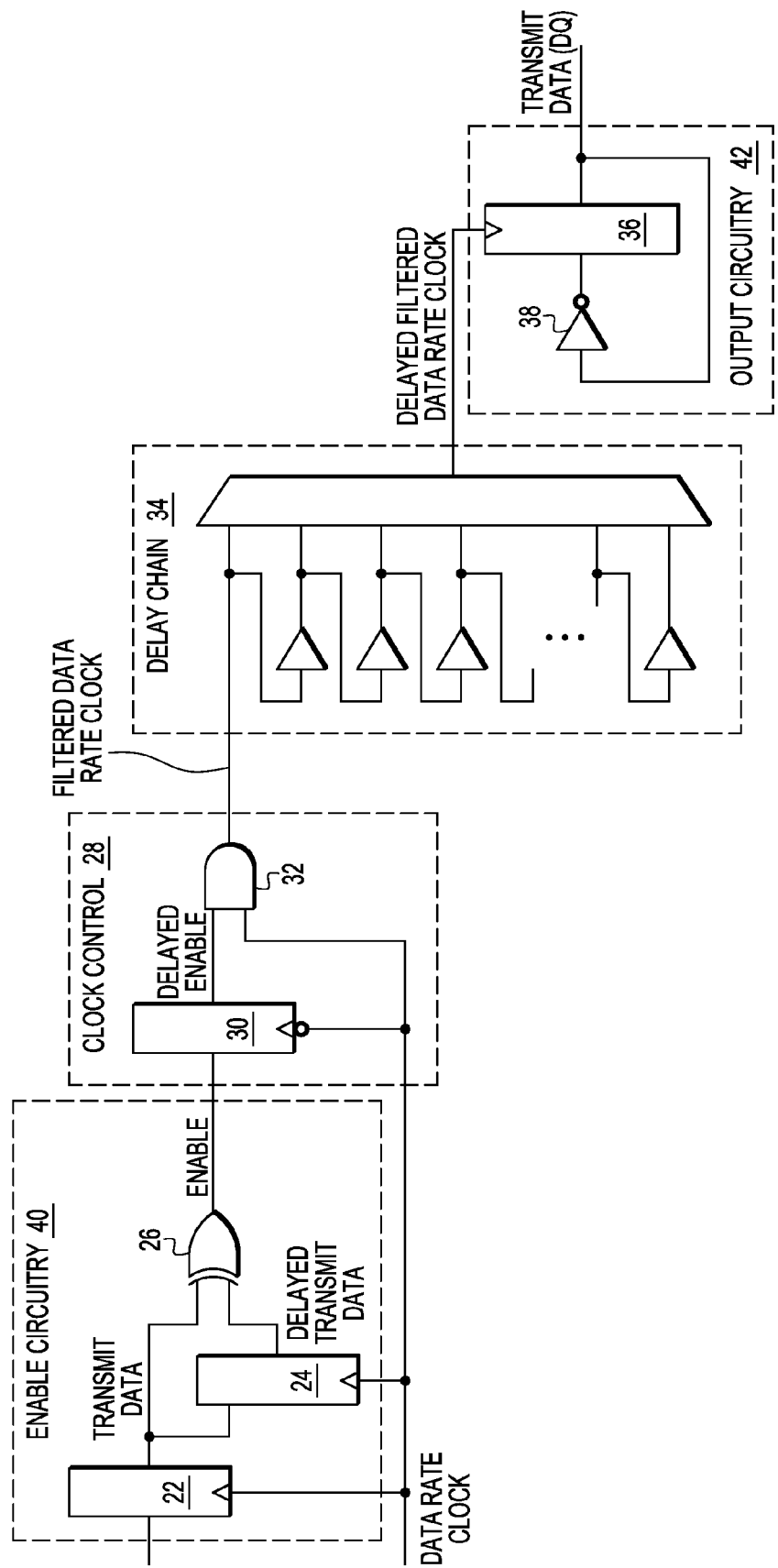
FIG. 2 illustrates a block diagram of example data generation circuitry implemented in a memory controller of a data processing system in which the disclosure is implemented, according to some embodiments.

FIG. 2 illustrates a block diagram of example data generation circuitry 18 implemented in a memory controller 14 of data processing system 10. Data generation circuitry 18 includes enable circuitry 40, clock control circuitry 28, delay chain circuitry 34, and output circuitry 42, which are further discussed below.

Enable circuitry 40 includes a flip flop (FF) 22, FF 24, and a logic gate 26. A flip flop (or other delay unit) is a circuit configured to store a data value for a clock cycle (or other amount of delay) when setup and hold time requirements of the flip flop are satisfied. It is noted that setup and hold time requirements are satisfied for the flip flops discussed herein (e.g., FFs 22, 24, 30, and 36). Data that is to be transmitted to memory 16 is received at an input of flip flop (FF) 22, which is clocked on a positive (or rising) edge of a Data Rate Clock generated by memory controller 14. FF 22 is configured to output a delayed version of the (input) data as Transmit Data. Transmit Data is received as an input to FF 24, which is also clocked on a positive (or rising) edge of Data Rate Clock. FF 24 is configured to output a delayed version of Transmit Data as Delayed Transmit Data. In other words, Delayed Transmit Data tracks the immediately previous value of Transmit Data.

The output of FF 22 (Transmit Data) and the output of FF 24 (Delayed Transmit Data) are provided to logic gate 26, which implements an XOR logic function in the embodiment illustrated. Logic gate 26 (e.g., a comparator) is configured to compare the value of Transmit Data with the value of Delayed Transmit Data, which is equivalent to comparing the present value of Transmit Data with the immediately previous value of Transmit Data, and to output an Enable signal based on the comparison of the values. In response to the values of Transmit Data and Delayed Transmit Data being different values (which indicates that the present value of Transmit Data has changed from the immediately previous value of Transmit Data), logic gate 26 outputs an asserted Enable signal (e.g., outputs a logic high signal). In response to the values of Transmit Data and Delayed Transmit Data being matching values (which indicates that the present value of Transmit Data has not changed from the immediately previous value of Transmit Data), logic gate 26 outputs a non-asserted Enable signal (e.g., outputs a logic low signal). In this manner, Enable signal reflects a transition state of the present value of Transmit Data from the immediately previous value of Transmit Data, where the transition state of the present value is either a changed state (e.g., an asserted Enable signal representing a first logic state) or a non-changed state (e.g., a non-asserted Enable signal representing a second logic state). The Enable signal is provided to clock control circuitry 28.

Clock control circuitry 28 includes a FF 30 and a logic gate 32. The Enable signal output by logic gate 26 is provided as an input to FF 30, which is clocked on a negative (or falling) edge of Data Rate Clock. FF 30 is configured to output a delayed version of the Enable signal. The output of FF 30 is received as an input at logic gate 32, which implements an AND logic function in the embodiment illustrated. Data Rate Clock is also received as an input at logic gate 32. Logic gate 32 is configured to compare the value of the delayed Enable signal with the value of Data Rate Clock and to output a filtered Data Rate Clock based on the comparison of the values. In response to the Enable signal being asserted, logic gate 26 passes the pulses of Data Rate Clock (e.g., alternating sequence of a logic high signal and a logic low signal). In response to the Enable signal being non-asserted, logic gate 26 filters out the pulses of Data Rate Clock (e.g., outputs a logic low signal). In this manner, the Delayed Enable signal controls the output of logic gate 32 to generate a Filtered Data Rate Clock that reflects the transition states of Transmit Data, where a pulse of the Filtered Data Rate Clock reflects the changed state and an absence of a pulse of the Filtered Data Rate Clock reflects the non-changed state. In other words, the Delayed Enable signal acts as a clock enable signal for Filtered Data Rate Clock that allows pulses to run during the changed state, while disabling such pulses during the non-changed state. The Filtered Data Rate Clock is provided as an input to delay chain circuitry 34. It is noted that the enable circuitry 40 and clock control circuitry 28 may be implemented in various ways to achieve the same Filtered Data Rate Clock (e.g., the Enable signal may be active low; logic gate 32 may implement a different type of logic gate; FF 30 may utilize a different delay element that provides enough margin for the Enable signal to properly filter the Data Rate Clock without glitches).

Delay chain circuitry 34 is configured to introduce a variable amount of delay into the Filtered Data Rate Clock. Delay chain circuitry 34 includes a number of delay elements that are connected in series and a multiplexer having a number of input lines corresponding to the output of each of the delay elements. It is noted that in the embodiment illustrated, the first input line of the multiplexer does not have a delay element, while the remaining input lines each correspond to a delay element (e.g., for N input lines of the multiplexer, there are N−1 input lines that have corresponding delay elements). A particular amount of delay can be selected by selecting one of the multiplexer input lines, where the selected input line corresponds to a delayed version of the input signal (or the Filtered Data Rate Clock) resulting from passing through a corresponding number of delay elements (e.g., which may include no delay elements if the first input line of the illustrated multiplexer is selected). Delay chain circuitry 34 is configured to output a delayed version of Filtered Data Rate Clock, which is referred to as Delayed Filtered Data Rate Clock. As filtered Data Rate Clock travels through the delay elements of delay chain circuitry 34, some duty cycle degradation may occur, resulting in the negative edges of Delayed Filtered Data Rate Clock being skewed in comparison to the negative edges of Filtered Data Rate Clock (e.g., the original input signal). Duty cycle of Delayed Filtered Data Rate Clock is not critical to operation of data generation circuitry 18. Delayed Filtered Data Rate Clock is provided to output circuitry 42.

Output circuitry 42 includes a toggle flip flop or similar circuitry configured to change output signal state based on the positive edge of Delayed Filtered Data Rate Clock. In the embodiment illustrated, the toggle flip flop includes FF 36 and inverter 38. The output of FF 36 is provided to the input of inverter 38, where the output of inverter 38 is provided as the input of FF 36. FF 36 is clocked on the positive (or rising) edge of Delayed Filtered Data Rate Clock. At each positive edge of Delayed Filtered Data Rate Clock, FF 36 toggles its output signal (e.g., alternates between a logic high signal and a logic low signal) to generate Transmit Data (DQ) for transmission to memory 16. Since FF 36 is toggled on only the positive (or rising) edges of Delayed Filtered Data Rate Clock, any duty cycle degradation that may have occurred in Delayed Filtered Data Rate Clock is effectively removed from Transmit Data (DQ).

Figure 3:
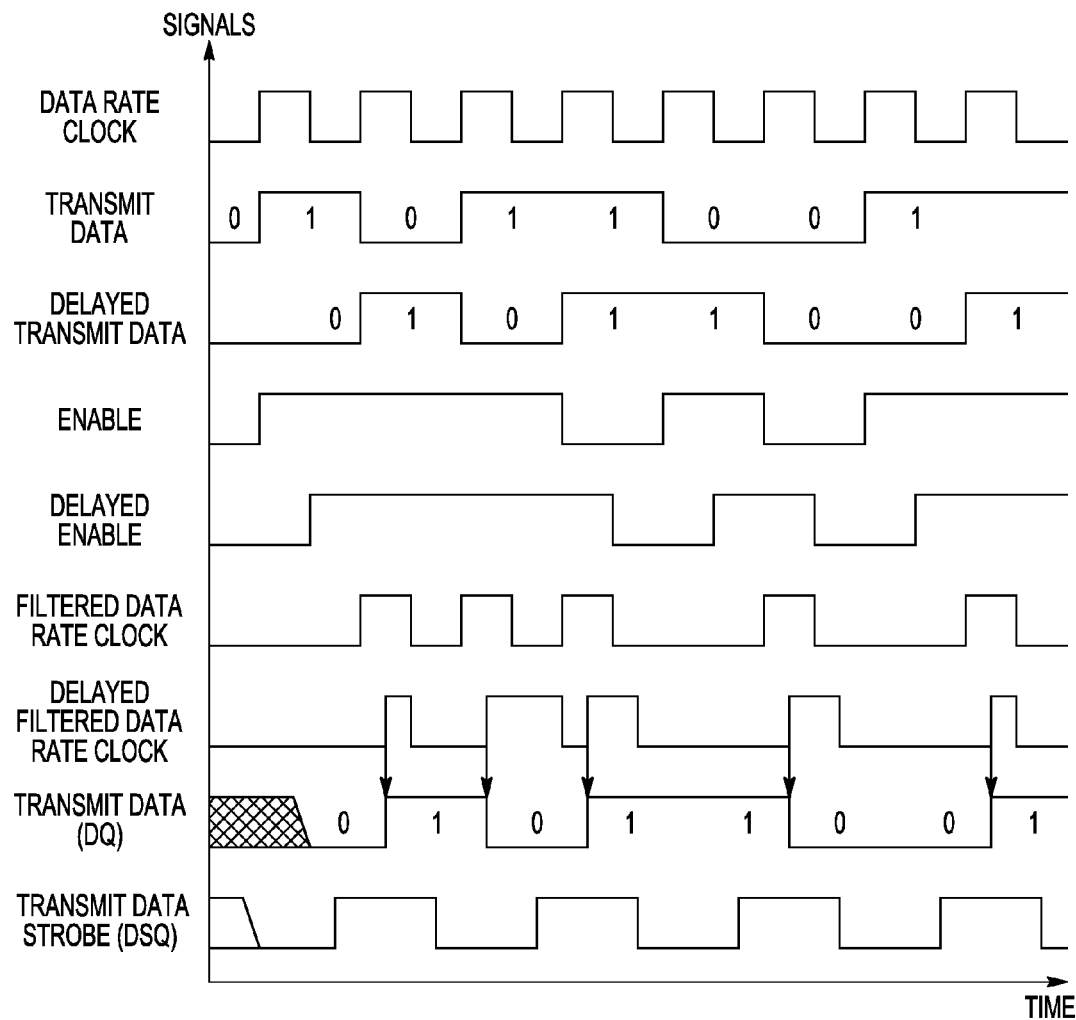
FIG. 3 illustrates waveforms of example signals present at nodes within data generation circuitry in which the disclosure is implemented, according to some embodiments.

FIG. 3 illustrates waveforms of example signals present at nodes within data generation circuitry 18 of FIG. 2. A waveform for Data Rate Clock is shown at the top of FIG. 3, followed by waveforms for Transmit Data, Delayed Transmit Data, Enable, Delayed Enable, Filtered Data Rate Clock, Delayed Filtered Data Rate Clock, Transmit Data (DQ), and Transmit Data Strobe (DQS). In some embodiments, the signals discussed below may be initialized as a non-asserted signal (e.g., logic low signal).

Data Rate Clock is generated by memory controller 14 and is illustrated as a square wave periodic clock signal having a 50% duty cycle. Transmit Data is output from FF 22, which is clocked on the positive edge of Data Rate Clock. Transmit Data includes an example sequence of data beats that is to be transmitted to memory 16, illustrated in FIG. 3 as the signal "01011001." Delayed Transmit Data is output from FF 24, which is also clocked on the positive edge of Data Rate Clock. Delayed Transmit Data includes a delayed version of the signal "01011001" (e.g., delayed by a single clock cycle).

Enable signal is output by logic gate 26, which compares the values of Transmit Data and Delayed Transmit Data. When the values of Transmit Data and Delayed Transmit Data are different, logic gate 26 immediately outputs an asserted Enable signal (which is illustrated as a logic high signal). When the values of Transmit Data and Delayed Transmit Data are the same, logic gate 26 immediately outputs a non-asserted Enable signal (which is illustrated as a logic low signal). For example, the Enable waveform illustrated in FIG. 3 becomes logic high at the first positive edge illustrated for Data Rate Clock while Transmit Data is 1 and Delayed Transmit Data is 0 (e.g., are different values), reflecting that the present value of Transmit Data has changed from the immediately previous value (as tracked by Delayed Transmit Data). The Enable waveform remains logic high for two more Data Rate Clock cycles while Transmit Data and Delayed Transmit Data are different values until Transmit Data is 1 and Delayed Transmit Data is 1 (e.g., are the same values), reflecting that the present value of Transmit Data has not changed from the immediately previous value. The Enable waveform continues in this manner, reflecting the transition states of the present value of Transmit Data.

Delayed Enable signal is output by FF 30, which is clocked on the negative edge of Data Rate Clock. Delayed Enable signal includes a delayed version of Enable signal (e.g., delayed by half a clock cycle, since FF 30 is clocked on the negative edge). Filtered Data Rate Clock is output by logic gate 32, which compares the value of Delayed Enable signal with the value of Data Rate Clock. When Delayed Enable signal is asserted, logic gate 32 immediately outputs the pulses of the Data Rate Clock as Filtered Data Rate Clock. When Delayed Enable signal is non-asserted, logic gate 32 outputs a logic low signal as Filtered Data Rate Clock. For example, the Filtered Data Rate Clock illustrated in FIG. 3 initially passes three Data Rate Clock pulses while Delayed Enable is logic high to reflect the three changed transition states of Transmit Data, then a logic low signal while Delayed Enable is logic low to reflect the non-changed transition state of Transmit Data. The Filtered Data Rate Clock subsequently passes two additional pulses.

Delayed Filtered Data Rate Clock is output by delay chain 34, which may introduce duty cycle degradation. As illustrated in FIG. 3, Filtered Data Rate Clock has a 50% duty cycle, while Delayed Filtered Data Rate Clock has various duty cycles ranging from 25% to 75%, although smaller and larger duty cycles may be introduced. Delay chain 34 outputs a delayed version of the Filtered Data Rate Clock as Delayed Filtered Data Rate Clock (e.g., delayed by a quarter of a clock cycle in the embodiment illustrated).

Transmit Data (DQ) is output by FF 36, which is clocked on the positive edge of Delayed Filtered Data Rate Clock. FF 36 toggles its output (through use of inverter 38) on each positive edge of Delayed Filtered Data Rate, where each positive edge indicates a changed transition state of (input) Transmit Data. For example, on receipt of a first rising edge of Delayed Filtered Data Rate, FF 36 toggles its output from 0 to 1. On a subsequent rising edge of Delayed Filtered Data Rate, FF 36 toggles its output from 1 to 0. On a third rising edge of Delayed Filtered Data Rate, FF 36 toggles its output from 0 to 1. FF 36 continues to output a given value until a positive edge of Delayed Filtered Data Rate Clock is received. For example, FF 36 outputs 1 until a subsequent positive edge of Delayed Filtered Data Rate Clock is received. Since negative edges of Delayed Filtered Data Rate Clock are disregarded, data beats of Transmit Data (DQ) are recreated without duty cycle degradation. Memory controller 14 also generates Transmit Data Strobe (DQS) having each positive and negative edge centered within a data beat. Transmit Data (DQ) and Transmit Data Strobe (DQS) are transmitted to memory 16.

By now it should be appreciated that there has been provided a mechanism for data generation implemented in a data processing system that recreates a data signal for transmission to memory without introducing duty cycle degradation from delay elements.

In one embodiment of the present disclosure, an integrated circuit is provided, which includes enable circuitry coupled to receive transmit data and configured to set a clock enable to a first logic state when a data value of the transmit data changes to a different logic state. The integrated circuit also includes clock control circuitry coupled to receive the clock enable and a data rate clock and configured to provide a filtered data rate clock, where the clock control circuitry is configured to provide the data rate clock as the filtered data rate clock while the clock enable is the first logic state. The integrated circuit also includes a flip flop having a clock input coupled to receive the filtered data rate clock, a data output coupled to provide final transmit data in response to the filtered data rate clock, and an inverting data input coupled to the data output, where the final transmit data corresponds to a first delayed version of the transmit data received by the enable circuitry.

One aspect of the above embodiment provides that the enable circuitry includes a delay unit coupled to receive the transmit data and configured to provide a second delayed version of the transmit data received by the enable circuitry; and a comparator having a first input coupled to the transmit data and a second input coupled to receive the second delayed version of the transmit data, and an output to provide the clock enable based on comparisons between data values of the transmit data and the second delayed version of the transmit data.

A further aspect of the above embodiment provides that the transmit data and the second delayed version of the transmit data are delayed with respect to each other by a predetermined number of clock cycles of the data rate clock.

Another aspect of the above embodiment provides that the clock control circuitry is configured to delay the clock enable prior to using the clock enable to provide the filtered data rate clock.

Another aspect of the above embodiment provides that the enable circuitry is configured to set the clock enable to a second logic state, different from the first logic state, when the data value of the transmit data does not change.

Another aspect of the above embodiment provides that the clock control circuitry is configured to provide a predetermined logic state as the filtered data rate clock while the clock enable is negated.

Another aspect of the above embodiment provides that the integrated circuit further includes a delay chain coupled between the clock control circuitry and the flip flop, where the delay chain is configured to delay the filtered data rate clock prior to providing the filtered data rate clock to the clock input of the flip flop.

A further aspect of the above embodiment provides that the delay chain affects a duty cycle of the filtered data rate clock provided to the clock input of the flip flop.

Another further aspect of the above embodiment provides that the flip flop is configured to provide values of the final transmit data in response to one of rising or falling edges of the filtered data rate clock provided to the clock input of the flip flop.

In another embodiment of the present disclosure, a method is provided, which includes comparing transmit data to a first delayed version of the transmit data to generate a clock enable signal. The method also includes generating a filtered data rate clock signal based on a data rate clock signal and the clock enable signal, where the data rate clock signal is provided as the filtered data rate clock signal when the clock enable signal has a first logic state and a predetermined logic state is provided as the filtered data rate clock signal when the clock enable signal has a second logic state. The method also includes generating final transmit data in response to one of rising or falling edges of the filtered data rate clock signal, where the final transmit data corresponds to a second delayed version of the transmit data.

One aspect of the above embodiment provides that the comparing the transmit data to the first delayed version of the transmit data to generate the clock enable signal includes setting the clock enable signal to the first logic state when compared values are different logic states; and setting the clock enable signal to the second logic state when compared values are a same logic state.

A further aspect of the above embodiment provides that the transmit data and the first delayed version of the transmit data are delayed with respect to each other by a predetermined number of clock cycles of the data rate clock signal.

Another aspect of the above embodiment provides that the method further includes delaying the filtered data rate clock signal through a delay chain prior to generating the final transmit data.

Another aspect of the above embodiment provides that the method further includes delaying the clock enable signal prior to generating the filtered data rate clock signal based on the data rate clock signal and the clock enable signal.

Another aspect of the above embodiment provides that the generating the final transmit data in response to the one of the rising or falling edges of the filtered data rate clock signal includes providing the filtered data rate clock signal to a clock input of a flip flop; and providing a data output of the flip flop to an inverting data input of the flip flop, where the data output of the flip flop provides the final transmit data.

In another embodiment of the present disclosure, an integrated circuit is provided, which includes a first delay unit having an input to receive transmit data and an output to provide a first delayed version of the transmit data. The integrated circuit also includes a comparator having a first input coupled to receive the transmit data, a second input coupled to receive the first delayed version of the transmit data, and an output coupled to provide a clock enable signal. The integrated circuit also includes clock control circuitry coupled to receive the clock enable and a data rate clock and coupled to provide a filtered data rate clock, where the clock control circuitry is configured to provide the data rate clock as the filtered data rate clock while the clock enable has a first logic state. The integrated circuit also includes a delay chain having an input to receive the filtered data rate clock and an output coupled to provide a delayed filtered data rate clock. The integrated circuit also includes a flip flop having a clock input coupled to receive the delayed filtered data rate clock, a data output coupled to provide final transmit data in response to the filtered data rate clock, and an inverting data input coupled to the data output, where the final transmit data corresponds to a second delayed version of the transmit data received by the first delay unit.

One aspect of the above embodiment provides that the comparator is configured to set the clock enable signal to the first logic state when values at the first and second inputs are different logic states and set the clock enable signal to a second logic state, different from the first logic state, when values at the first and second inputs are a same logic state.

One aspect of the above embodiment provides that the transmit data and the first delayed version of the transmit data are delayed with respect to each other by a predetermined number of clock cycles of the data rate clock.

One aspect of the above embodiment provides that the delay chain affects a duty cycle of the delayed filtered data rate clock provided to the clock input of the flip flop.

One aspect of the above embodiment provides that the flip flop is configured to provide values of the final transmit data in response to one of rising or falling edges of the delayed filtered data rate clock.

The circuitry described herein may be implemented on a semiconductor substrate, which can be any semiconductor material or combinations of materials, such as gallium arsenide, silicon germanium, silicon-on-insulator (SOI), silicon, monocrystalline silicon, the like, and combinations of the above.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "bus 60 [7:0]" or "conductors [7:0] of bus 60" indicates the eight lower order conductors of bus 60, and "address bits [7:0]" or "ADDRESS [7:0]" indicates the eight lower order bits of an address value. The symbol "$" preceding a number indicates that the number is represented in its hexadecimal or base sixteen form. The symbol "%" preceding a number indicates that the number is represented in its binary or base two form.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
    enable circuitry coupled to receive transmit data and configured to set a clock enable to a first logic state when a data value of the transmit data changes to a different logic state;
    clock control circuitry coupled to receive the clock enable and a data rate clock and configured to provide a filtered data rate clock, wherein the clock control circuitry is configured to provide the data rate clock as the filtered data rate clock while the clock enable is the first logic state; and
    a flip flop having a clock input coupled to receive the filtered data rate clock, a data output coupled to provide final transmit data in response to the filtered data rate clock, and an inverting data input coupled to the data output, wherein the final transmit data corresponds to a first delayed version of the transmit data received by the enable circuitry.

2. The integrated circuit of claim 1, wherein the enable circuitry comprises:
    a delay unit coupled to receive the transmit data and configured to provide a second delayed version of the transmit data received by the enable circuitry; and
    a comparator having a first input coupled to the transmit data and a second input coupled to receive the second delayed version of the transmit data, and an output to provide the clock enable based on comparisons between data values of the transmit data and the second delayed version of the transmit data.

3. The integrated circuit of claim 2, wherein the transmit data and the second delayed version of the transmit data are delayed with respect to each other by a predetermined number of clock cycles of the data rate clock.

4. The integrated circuit of claim 1, wherein the clock control circuitry is configured to delay the clock enable prior to using the clock enable to provide the filtered data rate clock.

5. The integrated circuit of claim 1, wherein the enable circuitry is configured to set the clock enable to a second logic state, different from the first logic state, when the data value of the transmit data does not change.

6. The integrated circuit of claim 1, wherein the clock control circuitry is configured to provide a predetermined logic state as the filtered data rate clock while the clock enable is negated.

7. The integrated circuit of claim 1, further comprising:
    a delay chain coupled between the clock control circuitry and the flip flop, wherein the delay chain is configured to delay the filtered data rate clock prior to providing the filtered data rate clock to the clock input of the flip flop.

8. The integrated circuit of claim 7, wherein the delay chain affects a duty cycle of the filtered data rate clock provided to the clock input of the flip flop.

9. The integrated circuit of claim 7, wherein the flip flop is configured to provide values of the final transmit data in response to one of rising or falling edges of the filtered data rate clock provided to the clock input of the flip flop.

10. A method, comprising:
comparing transmit data to a first delayed version of the transmit data to generate a clock enable signal;
generating a filtered data rate clock signal based on a data rate clock signal and the clock enable signal, wherein the data rate clock signal is provided as the filtered data rate clock signal when the clock enable signal has a first logic state and a predetermined logic state is provided as the filtered data rate clock signal when the clock enable signal has a second logic state; and
generating final transmit data in response to one of rising or falling edges of the filtered data rate clock signal, wherein the final transmit data corresponds to a second delayed version of the transmit data.

11. The method of claim 10, wherein the comparing the transmit data to the first delayed version of the transmit data to generate the clock enable signal comprises:
setting the clock enable signal to the first logic state when compared values are different logic states; and
setting the clock enable signal to the second logic state when compared values are a same logic state.

12. The method of claim 11, wherein the transmit data and the first delayed version of the transmit data are delayed with respect to each other by a predetermined number of clock cycles of the data rate clock signal.

13. The method of claim 10, further comprising:
delaying the filtered data rate clock signal through a delay chain prior to generating the final transmit data.

14. The method of claim 10, further comprising:
delaying the clock enable signal prior to generating the filtered data rate clock signal based on the data rate clock signal and the clock enable signal.

15. The method of claim 10, wherein the generating the final transmit data in response to the one of the rising or falling edges of the filtered data rate clock signal comprises:
providing the filtered data rate clock signal to a clock input of a flip flop; and
providing a data output of the flip flop to an inverting data input of the flip flop, wherein the data output of the flip flop provides the final transmit data.

16. An integrated circuit, comprising:
a first delay unit having an input to receive transmit data and an output to provide a first delayed version of the transmit data;
a comparator having a first input coupled to receive the transmit data, a second input coupled to receive the first delayed version of the transmit data, and an output coupled to provide a clock enable signal;
clock control circuitry coupled to receive the clock enable and a data rate clock and coupled to provide a filtered data rate clock, wherein the clock control circuitry is configured to provide the data rate clock as the filtered data rate clock while the clock enable has a first logic state;
a delay chain having an input to receive the filtered data rate clock and an output coupled to provide a delayed filtered data rate clock; and
a flip flop having a clock input coupled to receive the delayed filtered data rate clock, a data output coupled to provide final transmit data in response to the filtered data rate clock, and an inverting data input coupled to the data output, wherein the final transmit data corresponds to a second delayed version of the transmit data received by the first delay unit.

17. The integrated circuit of claim 16, wherein the comparator is configured to set the clock enable signal to the first logic state when values at the first and second inputs are different logic states and set the clock enable signal to a second logic state, different from the first logic state, when values at the first and second inputs are a same logic state.

18. The integrated circuit of claim 16, wherein the transmit data and the first delayed version of the transmit data are delayed with respect to each other by a predetermined number of clock cycles of the data rate clock.

19. The integrated circuit of claim 16, wherein the delay chain affects a duty cycle of the delayed filtered data rate clock provided to the clock input of the flip flop.

20. The integrated circuit of claim 16, wherein the flip flop is configured to provide values of the final transmit data in response to one of rising or falling edges of the delayed filtered data rate clock.

* * * * *